United States Patent
Zha

(10) Patent No.: US 10,274,645 B2
(45) Date of Patent: Apr. 30, 2019

(54) MANUFACTURING METHOD OF MICRO-NANO STRUCTURE ANTIREFLECTIVE COATING LAYER AND DISPLAY APPARATUS THEREOF

(71) Applicant: Wuhan China Star Optoelectronics Technology Co., Ltd., Wuhan (CN)

(72) Inventor: Guowei Zha, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 109 days.

(21) Appl. No.: 15/325,448

(22) PCT Filed: Dec. 28, 2016

(86) PCT No.: PCT/CN2016/112535
§ 371 (c)(1),
(2) Date: Jan. 11, 2017

(87) PCT Pub. No.: WO2018/094806
PCT Pub. Date: May 31, 2018

(65) Prior Publication Data
US 2018/0143352 A1 May 24, 2018

(51) Int. Cl.
| | | |
|---|---|---|
| G02B 1/113 | (2015.01) |
| C03C 17/34 | (2006.01) |
| C03C 17/23 | (2006.01) |
| C01B 32/186 | (2017.01) |
| B32B 3/30 | (2006.01) |
| B81C 1/00 | (2006.01) |
| B82B 3/00 | (2006.01) |
| C01B 32/188 | (2017.01) |
| G02B 1/118 | (2015.01) |

(52) U.S. Cl.
CPC ............... *G02B 1/113* (2013.01); *B32B 3/30* (2013.01); *B81C 1/00555* (2013.01); *B82B 3/0095* (2013.01); *C01B 32/186* (2017.08); *C01B 32/188* (2017.08); *C03C 17/23* (2013.01); *C03C 17/3441* (2013.01); *G02B 1/118* (2013.01); *B81C 2201/0177* (2013.01); *C01B 2204/20* (2013.01); *C03C 2217/734* (2013.01)

(58) Field of Classification Search
CPC .......... G02B 1/113; G02B 1/115; G02B 1/118
See application file for complete search history.

(56) References Cited

U.S. PATENT DOCUMENTS

2013/0099196 A1* 4/2013 Wu ................... H01L 21/02376
257/9

\* cited by examiner

*Primary Examiner* — Alex A Rolland

(57) ABSTRACT

A manufacturing method of micro-nano structure antireflective coating layer and a display apparatus thereof are described. The method includes providing a substrate, forming a silicon oxide layer on the substrate, forming a graphene layer with a hexagonal honeycomb lattice on the silicon oxide layer, and forming a bottom surface of the antireflective coating layer in the nucleation points by serving the graphene layer as a growing base layer, wherein a diffusion length and an atomic mass of diffusion atoms of the antireflective coating layer are decreased with time by a gradient growing manner to form a upper surface of the antireflective coating layer.

14 Claims, 3 Drawing Sheets

US 10,274,645 B2

MANUFACTURING METHOD OF MICRO-NANO STRUCTURE ANTIREFLECTIVE COATING LAYER AND DISPLAY APPARATUS THEREOF

RELATED APPLICATIONS

This application is a National Phase of PCT Patent Application No. PCT/CN2016/112535 having International filing date of Dec. 28, 2016, which claims the benefit of priority of Chinese Patent Application No. 201611046277.3 filed on Nov. 22, 2016. The contents of the above applications are all incorporated by reference as if fully set forth herein in their entirety.

FIELD AND BACKGROUND OF THE INVENTION

The present invention relates to a technical field of a liquid crystal display (LCD), and more particularly to a manufacturing method of micro-nano structure antireflective coating layer and a display apparatus thereof.

Since an LCD is widely used in different applications, a leading display technique is implemented by an active luminous theorem of a display apparatus, where a reflection of sunlight downgrades a contrast of a display frame.

An antireflection process is performed on the display to reduce the reflection effect of the sunlight on the display frame. One manufacturing method is to form surface micro-nano structures, where a photo-resist layer is formed on a thin film using a micro-electronic process apparatus and the thin film is etched to produces the surface micro-nano structures. However, the manufacturing cost of photo-resist layer used by micro-electronic process apparatus is too high and a line-width precision of photo-resist layer is difficult to achieve the requirement, resulting in complicated processing steps.

Consequently, there is a need to develop a manufacturing method of micro-nano structure antireflective coating and display apparatus thereof to solve the problems of the conventional technique.

SUMMARY OF THE INVENTION

Therefore, one objective of the present invention is to provide a manufacturing method of micro-nano structure antireflective coating layer to solve the problems of complicated processing steps, manufacturing costs and a lower line-width precision of the micro-nano structure antireflective coating layer.

Based on the above objective, the present invention sets forth the following technical solutions. The present invention provides a method of manufacturing a micro-nano structure antireflective coating layer, comprising providing a substrate; forming a silicon oxide layer on the substrate, wherein the silicon oxide layer comprises a plurality of holes which provide a plurality of nucleation points of an antireflective coating layer; forming a graphene layer with a hexagonal honeycomb lattice on the silicon oxide layer; and forming a bottom surface of the antireflective coating layer in the nucleation points by serving the graphene layer as a growing base layer so that the bottom surface is a hexagonal shape, wherein a diffusion length and an atomic mass of diffusion atoms of the antireflective coating layer are decreased with time by a gradient growing manner to form a upper surface of the antireflective coating layer; wherein the gradient growing manner comprises a growth temperature adjustment and a control concentration of a growth source, and wherein a material of the antireflective coating layer is either zinc oxide or silicon.

In the method of manufacturing the micro-nano structure antireflective coating layer, a formation the graphene layer is selected from one group consisting of a chemical vapor deposition method, an epitaxially silicon carbide extension in a temperature annealing manner, and an epitaxially single crystal metal surface extension manner.

In the method of manufacturing the micro-nano structure antireflective coating layer, a shape of the upper surface is either a hexagonal or circular shape.

In the method of manufacturing the micro-nano structure antireflective coating layer, an area of the bottom surface is greater than an area of the upper surface.

In the method of manufacturing the micro-nano structure antireflective coating layer, a diameter of the bottom surface has a range from 100 to 900 nanometers.

In the method of manufacturing the micro-nano structure antireflective coating layer, a distance between the bottom surface and the upper surface has a range from 100 to 1000 nanometers.

The present invention further provides a method of manufacturing a micro-nano structure antireflective coating layer, comprising providing a substrate; forming a silicon oxide layer on the substrate, wherein the silicon oxide layer comprises a plurality of holes which provide a plurality of nucleation points of an antireflective coating layer; forming a graphene layer with a hexagonal honeycomb lattice on the silicon oxide layer; and forming a bottom surface of the antireflective coating layer in the nucleation points by serving the graphene layer as a growing base layer so that the bottom surface is a hexagonal shape, wherein a diffusion length and an atomic mass of diffusion atoms of the antireflective coating layer are decreased with time by a gradient growing manner to form a upper surface of the antireflective coating layer.

In the method of manufacturing the micro-nano structure antireflective coating layer, the gradient growing manner comprises a growth temperature adjustment and a control concentration of a growth source.

In the method of manufacturing the micro-nano structure antireflective coating layer, a material of the antireflective coating layer is either zinc oxide or silicon.

In the method of manufacturing the micro-nano structure antireflective coating layer, a formation the graphene layer is selected from one group consisting of a chemical vapor deposition method, an epitaxially silicon carbide extension in a temperature annealing manner, and an epitaxially single crystal metal surface extension manner.

In the method of manufacturing the micro-nano structure antireflective coating layer, a shape of the upper surface is either a hexagonal or circular shape.

In the method of manufacturing the micro-nano structure antireflective coating layer, an area of the bottom surface is greater than an area of the upper surface.

In the method of manufacturing the micro-nano structure antireflective coating layer, a diameter of the bottom surface has a range from 100 to 900 nanometers.

In the method of manufacturing the micro-nano structure antireflective coating layer, a distance between the bottom surface and the upper surface has a range from 100 to 1000 nanometers.

The present invention further a display apparatus comprising a micro-nano structure antireflective coating layer, a method of manufacturing the micro-nano structure antireflective coating layer comprising providing a substrate;

forming a silicon oxide layer on the substrate, wherein the silicon oxide layer comprises a plurality of holes which provide a plurality of nucleation points of an antireflective coating layer; forming a graphene layer with a hexagonal honeycomb lattice on the silicon oxide layer; and forming a bottom surface of the antireflective coating layer in the nucleation points by serving the graphene layer as a growing base layer so that the bottom surface is a hexagonal shape, wherein a diffusion length and an atomic mass of diffusion atoms of the antireflective coating layer are decreased with time by a gradient growing manner to form a upper surface of the antireflective coating layer.

In the display apparatus, the gradient growing manner comprises a growth temperature adjustment and a control concentration of a growth source.

In the display apparatus, a material of the antireflective coating layer is either zinc oxide or silicon.

In the display apparatus, a formation the graphene layer is selected from one group consisting of a chemical vapor deposition method, an epitaxially silicon carbide extension in a temperature annealing manner, and an epitaxially single crystal metal surface extension manner.

In the display apparatus, a shape of the upper surface is either a hexagonal or circular shape.

In the display apparatus, a diameter of the bottom surface has a range from 100 to 900 nanometers.

The micro-nano structure antireflective coating layer and the display apparatus of the present invention adopt a graphene layer with a hexagonal honeycomb lattice as a growth base to from the micro-nano structure antireflective coating layer, which simplify the manufacturing steps and form the micro-nano structure antireflective coating layer with a higher line-width precision to solve the problems of complicated processing steps, manufacturing costs and a lower line-width precision of the antireflective coating layer.

DESCRIPTION OF SPECIFIC EMBODIMENTS OF THE INVENTION

The following embodiments refer to the accompanying drawings for exemplifying specific implementable embodiments of the present invention.

Figure 1:
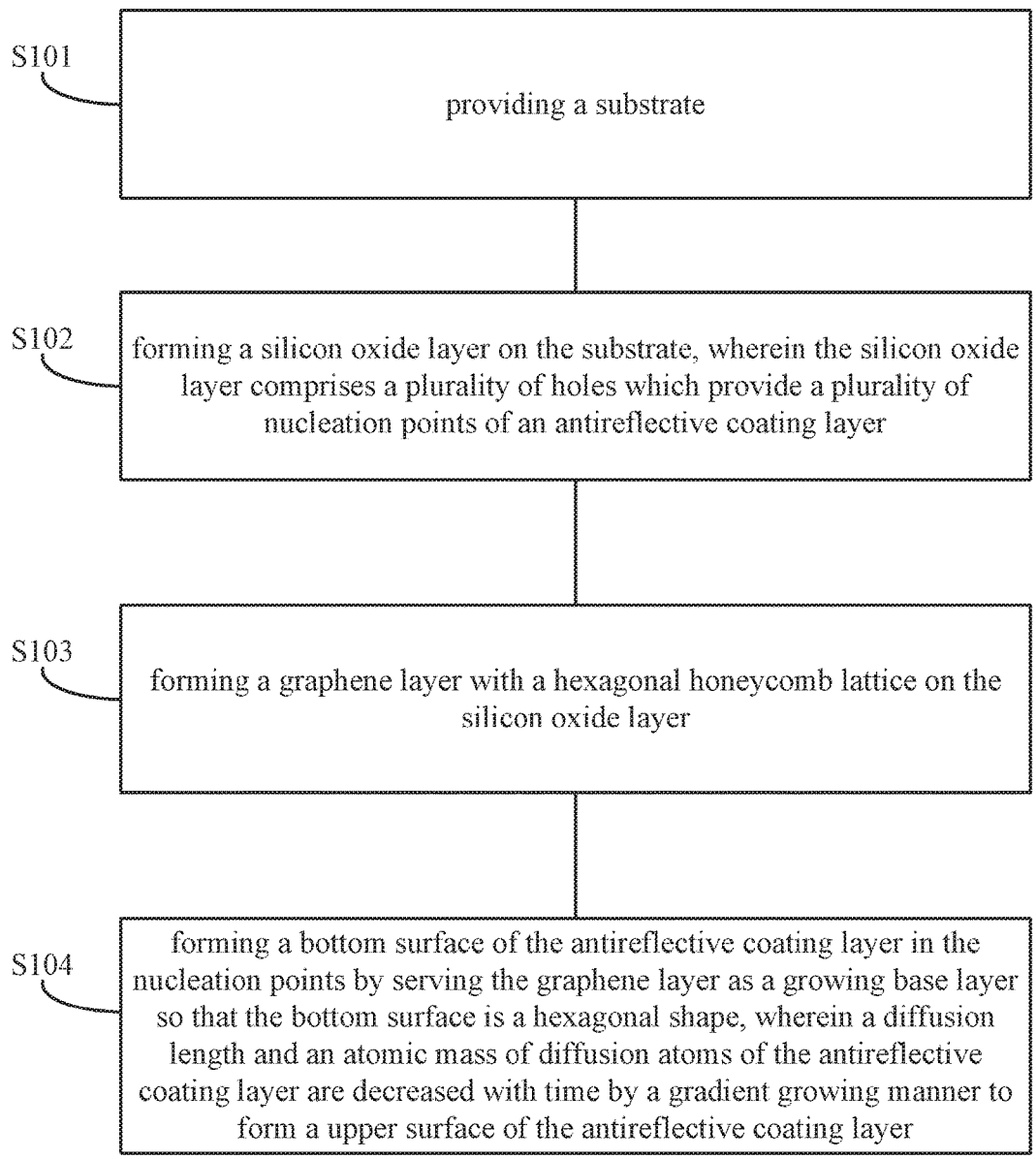
FIG. 1 is a flowchart of a manufacturing method of a micro-nano structure antireflective coating layer according to one preferred embodiment of the present invention.

Please refer to FIG. 1, which is a flowchart of a manufacturing method of a micro-nano structure antireflective coating layer according to one preferred embodiment of the present invention.

As shown in FIG. 1, a testing circuit of the liquid crystal display (LCD) according to one embodiment of the present including the following steps.

In the step S101, a substrate is provided.

In the step S102, a silicon oxide layer is formed on the substrate, where the silicon oxide layer includes a plurality of holes which provide a plurality of nucleation points of an antireflective coating layer.

In the step S103, a graphene layer with a hexagonal honeycomb lattice is formed on the silicon oxide layer.

In the step S104, the graphene layer serves as a growing base layer to form a bottom surface of the antireflective coating layer in the nucleation points so that the bottom surface is a hexagonal shape, where a diffusion length and an atomic mass of diffusion atoms of the antireflective coating layer are decreased with time by a gradient growing manner to form a upper surface of the antireflective coating layer.

Please refer to FIGS. 2A-2D, which are illustrative views of the manufacturing method of micro-nano structure antireflective coating layer according to one preferred embodiment of the present invention.

Figure 2A:
FIGS. 2A, 2B, 2C and 2D are illustrative views of the manufacturing method of micro-nano structure antireflective coating layer according to one preferred embodiment of the present invention.

Specifically, as shown in FIG. 2A with respect to the step S101, since the surface of a glass cover plate in the LCD apparatus reflects the light in the extremely ambient light environment, the contrast of the display frame is decreased. Thus, a micro-nano structure antireflective coating layer is formed on the glass cover plate in the present invention to solve the above-mentioned problem. In one preferred embodiment of the present invention, the substrate 201 is a glass cover plate, but not limited. Based on different requirements of forming the micro-nano structure antireflective coating layer, the substrate 201 is not limited to the glass cover plate. In the present invention, a glass cover plate of the substrate 201 is provided. Proceed to the step S102.

Figure 2B:
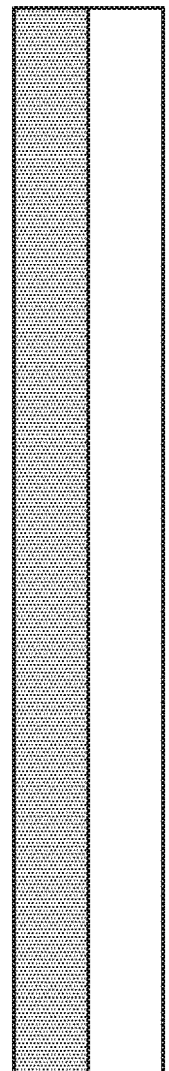

As shown in FIG. 2B with respect to the step S102, the silicon oxide layer 202 is formed on the substrate 201, where the silicon oxide layer 202 includes a plurality of holes which provide the nucleation points of an antireflective coating layer. In one preferred embodiment, the silicon oxide layer 202 is formed by either a magnetron sputtering manner or an evaporation manner. Due to a molecular structure of the silicon oxide layer 202, the silicon oxide layer 202 includes an uneven surface to form a hole structure (not shown). The holes provide the nucleation points for the antireflective coating layer and thus there is no need to form the holes by an additional step so as to simplify the manufacturing procedure.

Figure 2C:
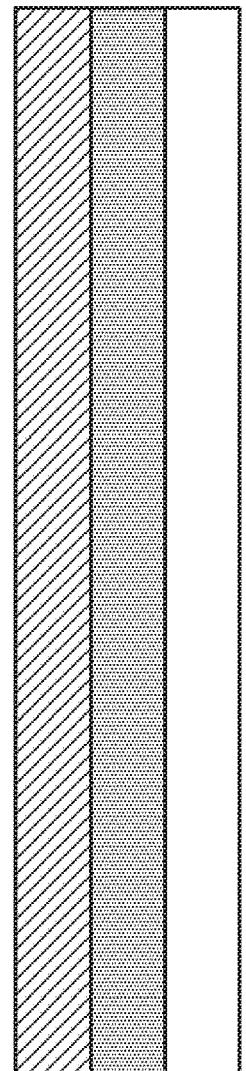

As shown in FIG. 2C with respect to the step S103, the graphene layer 203 with the hexagonal honeycomb lattice is formed on the silicon oxide layer 202. In at least one preferred embodiment, one of the following three manners is configured to form the graphene layer 203.

Preferably, a chemical vapor deposition method is implemented to form the graphene layer 203. A poly-crystal metal thin film with a catalytic function is deposited on a base of the silicon oxide layer 202 and the graphene layer 203 grows on the poly-crystal metal thin film by using a heat catalytic decomposition of the hydrocarbon.

Preferably, the graphene layer 203 is formed by an epitaxially silicon carbide extension in a temperature annealing manner. In one embodiment, the silicon atoms on a surface of the silicon carbide are evaporated and the carbon atoms remain surface of the silicon carbide to form the graphene layer 203.

Preferably, the graphene layer 203 is formed by an epitaxially single crystal metal surface extension manner. In one embodiment, the single crystal metal is formed on the surface of the silicon oxide layer 202. Thus, the graphene layer 203 grows and extends on the single crystal metal surface either by precipitating carbon dopants or by using a heat catalytic decomposition of the hydrocarbon within the single crystal metal.

Since the graphene layer 203 requires a strict formation environment and thus the substrate 201 can be easily damage, the graphene layer 203 is formed firstly and the formed graphene layer 203 are then transferred to the silicon oxide layer 202.

Figure 2D:
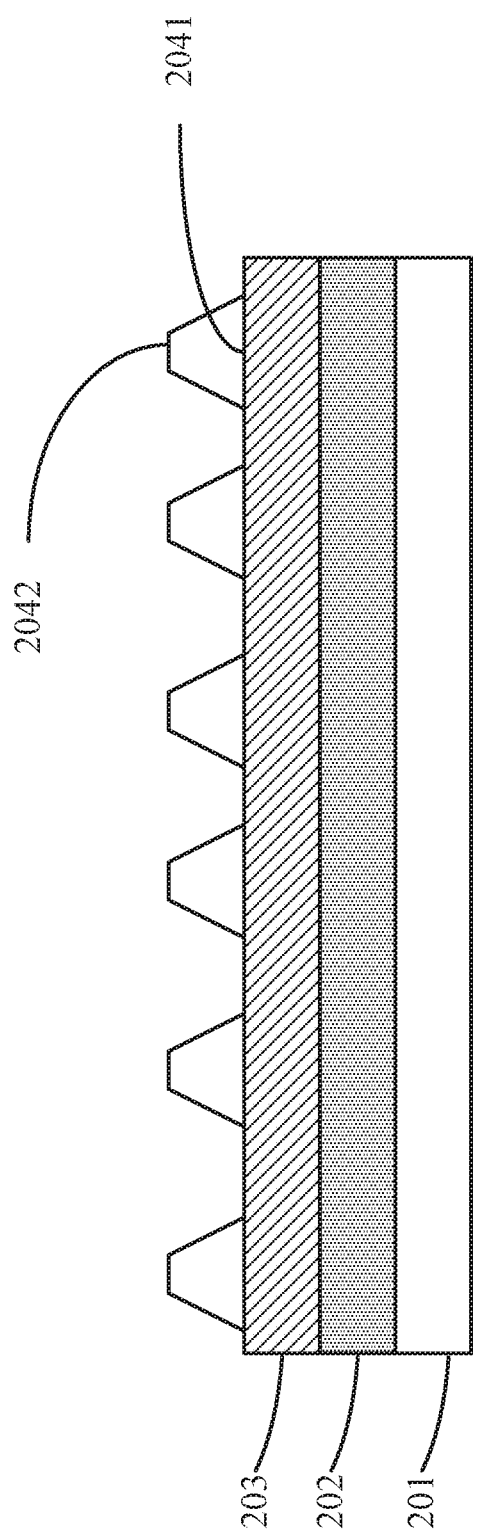

As shown in FIG. 2D with respect to the step S104, the graphene layer 203 serves as a growing base layer to form a bottom surface 2041 of the antireflective coating layer in the nucleation points so that the bottom surface 2041 is a hexagonal shape, where a diffusion length and an atomic mass of diffusion atoms of the antireflective coating layer are decreased with time by a gradient growing manner to form a upper surface 2042 of the antireflective coating layer.

The gradient growing manner includes a growth temperature adjustment and a control concentration of a growth source, where the material of the antireflective coating layer is zinc oxide or silicon which serves as the growth source.

Furthermore, the diameter of the bottom surface 2041 has a range from 100 to 900 nanometers and the shape of the bottom surface 2041 is either a hexagonal or a circular shape. The area of the bottom surface 2041 is greater than the area of the upper surface 2042. A distance between the bottom surface 2041 and the upper surface 2042 has a range from 100 to 1000 nanometers. In one embodiment, the micro-nano structure antireflective coating layer is formed by the gradient growing manner, where the diameter of the bottom surface is 300 nanometers, the diameter of the upper surface is 100 nanometers, and the distance between the bottom surface and the upper surface is 600 nanometers. Based on the testing result, a reflectivity of the micro-nano structure antireflective coating layer about a visible light frequency band is lower than 1% and the transmission rate of the micro-nano structure antireflective coating layer is higher than 99% to effectively anti-reflect the light.

In at least one embodiment of the present invention, the micro-nano structure antireflective coating layer adopts a graphene layer with a hexagonal honeycomb lattice as a growth base to from the micro-nano structure antireflective coating layer, which simplifies the manufacturing steps and forms the micro-nano structure antireflective coating layer with a higher line-width precision to solve the problems of complicated processing steps, manufacturing costs and a lower line-width precision of the antireflective coating layer.

The present invention further provides a display apparatus including a LCD panel, a glass cover plate, and a micro-nano structure antireflective coating layer on the surface of the glass cover plate.

The display apparatus can reduce the reflection on the surface of the glass cover plate in about display effect the extremely ambient light environment and simplifies the manufacturing steps of the micro-nano structure antireflective coating layer.

The manufacturing method of the micro-nano structure antireflective coating layer in the display apparatus is the same as these of the micro-nano structure antireflective coating layer and thus omitted herein.

In at least one embodiment of the present invention, the display apparatus adopts a graphene layer with a hexagonal honeycomb lattice as a growth base to from the micro-nano structure antireflective coating layer, which simplifies the manufacturing steps and forms the micro-nano structure antireflective coating layer with a higher line-width precision to solve the problems of complicated processing steps, manufacturing costs and a lower line-width precision of the antireflective coating layer.

The micro-nano structure antireflective coating layer and the display apparatus adopt a graphene layer with a hexagonal honeycomb lattice as a growth base to from the micro-nano structure antireflective coating layer, which simplify the manufacturing steps and form the micro-nano structure antireflective coating layer with a higher line-width precision to solve the problems of complicated processing steps, manufacturing costs and a lower line-width precision of the antireflective coating layer.

As is understood by a person skilled in the art, the foregoing preferred embodiments of the present invention are illustrative rather than limiting of the present invention. It is intended that they cover various modifications and similar arrangements be included within the spirit and scope of the present invention, the scope of which should be accorded the broadest interpretation so as to encompass all such modifications and similar structures.

What is claimed is:

1. A method of manufacturing a micro-nano structure antireflective coating layer, comprising:
    providing a substrate;
    forming a silicon oxide layer on the substrate, wherein the silicon oxide layer comprises a plurality of holes which provide a plurality of nucleation points of an antireflective coating layer;
    forming a graphene layer with a hexagonal honeycomb lattice on the silicon oxide layer; and
    forming a bottom surface of the antireflective coating layer in the nucleation points whereby the graphene layer serves as a growing base layer so that the bottom surface is a hexagonal shape, wherein a diffusion length and an atomic mass of diffusion atoms of the antireflective coating layer are decreased with time by a gradient growing manner to form a upper surface of the antireflective coating layer;
    wherein the gradient growing manner comprises a growth temperature adjustment and a control concentration of a growth source, and wherein a material of the antireflective coating layer is either zinc oxide or silicon.

2. The method of manufacturing the micro-nano structure antireflective coating layer of claim 1, wherein a formation the graphene layer is selected from one group consisting of a chemical vapor deposition method, an epitaxially silicon carbide extension in a temperature annealing manner, and an epitaxially single crystal metal surface extension manner.

3. The method of manufacturing the micro-nano structure antireflective coating layer of claim 1, wherein a shape of the upper surface is either a hexagonal or circular shape.

4. The method of manufacturing the micro-nano structure antireflective coating layer of claim 3, wherein an area of the bottom surface is greater than an area of the upper surface.

5. The method of manufacturing the micro-nano structure antireflective coating layer of claim 1, wherein a diameter of the bottom surface has a range from 100 to 900 nanometers.

6. The method of manufacturing the micro-nano structure antireflective coating layer of claim 1, wherein a distance between the bottom surface and the upper surface has a range from 100 to 1000 nanometers.

7. A method of manufacturing a micro-nano structure antireflective coating layer, comprising:
    providing a substrate;
    forming a silicon oxide layer on the substrate, wherein the silicon oxide layer comprises a plurality of holes which provide a plurality of nucleation points of an antireflective coating layer;
    forming a graphene layer with a hexagonal honeycomb lattice on the silicon oxide layer; and
    forming a bottom surface of the antireflective coating layer in the nucleation points whereby the graphene layer serves as a growing base layer so that the bottom surface is a hexagonal shape, wherein a diffusion length and an atomic mass of diffusion atoms of the antireflective coating layer are decreased with time by a gradient growing manner to form a upper surface of the antireflective coating layer.

8. The method of manufacturing the micro-nano structure antireflective coating layer of claim 7, wherein the gradient growing manner comprises a growth temperature adjustment and a control concentration of a growth source.

9. The method of manufacturing the micro-nano structure antireflective coating layer of claim 7, wherein a material of the antireflective coating layer is either zinc oxide or silicon.

10. The method of manufacturing the micro-nano structure antireflective coating layer of claim 7, wherein a formation the graphene layer is selected from one group consisting of a chemical vapor deposition method, an epitaxially silicon carbide extension in a temperature annealing manner, and an epitaxially single crystal metal surface extension manner.

11. The method of manufacturing the micro-nano structure antireflective coating layer of claim 7, wherein a shape of the upper surface is either a hexagonal or circular shape.

12. The method of manufacturing the micro-nano structure antireflective coating layer of claim 11, wherein an area of the bottom surface is greater than an area of the upper surface.

13. The method of manufacturing the micro-nano structure antireflective coating layer of claim 11, wherein a distance between the bottom surface and the upper surface has a range from 100 to 1000 nanometers.

14. The method of manufacturing the micro-nano structure antireflective coating layer of claim 7, wherein a diameter of the bottom surface has a range from 100 to 900 nanometers.

* * * * *

UNITED STATES PATENT AND TRADEMARK OFFICE
CERTIFICATE OF CORRECTION

PATENT NO. : 10,274,645 B2  
APPLICATION NO. : 15/325448  
DATED : April 30, 2019  
INVENTOR(S) : Guowei Zha Page 1 of 1

It is certified that error appears in the above-identified patent and that said Letters Patent is hereby corrected as shown below:

On the Title Page

Item (30) Foreign Application Priority Data  
Insert the following:  
-- Nov. 22, 2016 (CN)...................... 201611046277.3 --

Signed and Sealed this  
Sixth Day of August, 2019

Andrei Iancu  
*Director of the United States Patent and Trademark Office*